US012100665B2

(12) United States Patent
Hsu

(10) Patent No.: US 12,100,665 B2
(45) Date of Patent: Sep. 24, 2024

(54) SEMICONDUCTOR PACKAGE STRUCTURE AND MANUFACTURING METHOD THEREOF

(71) Applicant: Phoenix Pioneer Technology Co., Ltd., Hsinchu County (TW)

(72) Inventor: Che-Wei Hsu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 158 days.

(21) Appl. No.: 17/527,226

(22) Filed: Nov. 16, 2021

(65) Prior Publication Data
US 2022/0165674 A1 May 26, 2022

(30) Foreign Application Priority Data
Nov. 24, 2020 (TW) .................. 109141095

(51) Int. Cl.
*H01L 23/538* (2006.01)
*H01L 23/00* (2006.01)
(Continued)

(52) U.S. Cl.
CPC .......... *H01L 23/5389* (2013.01); *H01L 24/24* (2013.01); *H01L 24/73* (2013.01); *H01L 24/92* (2013.01); *H01L 25/50* (2013.01); *H01L 24/82* (2013.01); *H01L 25/16* (2013.01); *H01L 2224/24137* (2013.01); *H01L 2224/24146* (2013.01); *H01L 2224/73267* (2013.01); *H01L 2224/82005* (2013.01); *H01L 2224/82101* (2013.01); *H01L 2224/82106* (2013.01);
(Continued)

(58) Field of Classification Search
CPC ......... H01L 25/50; H01L 24/24; H01L 24/73; H01L 24/92; H01L 23/5389; H01L 2224/24137; H01L 2224/24146; H01L 2224/73267; H01L 2224/82005; H01L 2224/82101; H01L 2224/82106; H01L 2224/92244; H01L 2924/13091; H01L 2221/68345; H10K 10/00
USPC ...................................................... 257/774
See application file for complete search history.

(56) References Cited

U.S. PATENT DOCUMENTS

2012/0049334 A1* 3/2012 Pagaila ............... H01L 25/0655
438/107
2019/0214347 A1* 7/2019 Huang .................... H01L 24/92
(Continued)

*Primary Examiner* — Jasmine J Clark

(57) ABSTRACT

The present invention provides a semiconductor package structure including a first stacked structure and a second stacked structure, which is stacked on the first stacked structure. The first stacked structure includes a first dielectric layer, a first power chip, a first conductive connecting element, a first conductive pillar and a first patterned conductive layer. The second stacked structure includes a second dielectric layer, a second power chip, a second conductive connecting element, a second conductive pillar, a second patterned conductive layer, and a third patterned conductive layer. The first power chip and the second power chip are stacked to provide a smaller volume semiconductor package structure, that the first power chip and the second power chip may be directly electrically connected through the circuit structure and may eliminate the related disadvantages of the lead frame. In addition, a manufacturing method of a semiconductor package structure is also disclosed.

20 Claims, 12 Drawing Sheets

(51) Int. Cl.
*H01L 25/00* (2006.01)
*H01L 25/16* (2023.01)

(52) U.S. Cl.
CPC ............... *H01L 2224/92244* (2013.01); *H01L 2924/13091* (2013.01)

(56) References Cited

U.S. PATENT DOCUMENTS

2019/0333893 A1\* 10/2019 Yu ........................... H01L 24/20
2019/0385977 A1\* 12/2019 Elsherbini ............... H01L 24/95
2022/0045025 A1\* 2/2022 Hsu ........................ H01L 25/50

\* cited by examiner

SEMICONDUCTOR PACKAGE STRUCTURE AND MANUFACTURING METHOD THEREOF

CROSS REFERENCE TO RELATED APPLICATIONS

This Non-provisional application claims priority under 35 U.S.C. § 119(a) on Patent Application No. 109141095 filed in Republic of China on Nov. 24, 2020, the entire contents of which are hereby incorporated by reference.

BACKGROUND OF THE INVENTION

Field of the Invention

The present invention relates to a package structure and a manufacturing method thereof, and particularly to a semiconductor package structure and a manufacturing method thereof.

Descriptions of the Related Art

As the demand for information and the automobile electronics has grown substantially, the quad flat no-lead (QFN) packaging structure has become an important semiconductor packaging technology because of its better heat dissipation effect, lower impedance value and resistance to electromagnetic interference (EMI).

In the QFN package structure, the cooper clip technology is a technology produced in response to the demand for high power. The copper sheet is designed in the shape of an arch bridge with a height difference. The solder dispenser is used to join the copper sheet and the chip. It has a small impedance to carry large currents and can withstand deformation caused by thermal stress, so it is suitable for high power such as transistors.

Hereinafter, refer to FIGS. 1A to 1D to illustrate an example of using copper clip technology to bond transistors in the conventional package structure.

As shown in FIG. 1A, a solder paste layer 102 is formed on a lead frame 101 with screen printing. Then, as shown in FIG. 1B, a semiconductor chip 103 is placed on the solder paste layer 102. Then, as shown in FIG. 1C, tin solders 104 are formed on the semiconductor chip 103. Finally, as shown in FIG. 1D, a bridge cooper sheet 105 is disposed on the corresponding solder paste layer 102 and tin solders 104, and the lead frame 101, the semiconductor chip 103 and the bridge cooper sheet 105 are bonded to each other through a high temperature reflow welding of 380 degrees Celsius.

The above process and finished product have at least the following problems:
 First, the package structure uses the lead frame and the bridge cooper sheet, so the height (thickness) of the package structure cannot be reduced, thus limiting its application fields.
 Second, the tin solder or the solder paste contains a high proportion of lead, and lead will cause environmental pollution and have a considerable impact on human health.
 Third, before all the components are fixed under the high temperature reflow welding process of 380 degrees Celsius, component displacement may occur, resulting in a decrease in precision.

Therefore, it is one of the important subject matters to improve the above shortcomings and provide a semiconductor package structure and a manufacturing method thereof capable of integrating high-power components.

SUMMARY OF THE INVENTION

In view of the foregoing, one of the objectives of the invention is to provide a semiconductor package structure and a manufacturing method thereof to replace the use of the lead frame, reduce the height of the semiconductor package structure containing high-power components, and increase the electrical properties efficacy. Another objective of the invention is to provide the semiconductor package structure and the manufacturing method thereof, which can meet the requirements of environmental protection laws without using lead-containing manufacturing processes.

To achieve the above objective, the invention provides a semiconductor package structure including a first stacked structure and a second stacked structure. The first stacked structure is stacked onto the second stacked structure. The first stacked structure includes a first dielectric layer, a first patterned conductive layer, a first power chip, at least one first conductive connecting element, and at least one first conductive pillar. The second stacked structure includes a second dielectric layer, a second patterned conductive layer, a second power chip, at least one second conductive connecting element, at least one second conductive pillar, and a third patterned conductive layer.

The first dielectric layer has a first surface and a second surface disposed opposite to each other. The first patterned conductive layer is embedded in the first dielectric layer, and one side of the conductive layer is exposed to the first surface of the first dielectric layer. The first power chip is embedded in the first dielectric layer and has a first electrode layout and a second electrode layout opposite to each other. The first power chip is bonded to the first patterned conductive layer in the first dielectric layer with the second electrode layout side through a first conductive adhesive layer. In addition, the electrode pad on the first electrode layout of the first power chip is provided with at least one first conductive connecting element, and one end of the first conductive connecting element is exposed to the second surface of the first dielectric layer. The first conductive pillar is embedded in the first dielectric layer, and one end of the first conductive pillar is connected to the first patterned conductive layer in the first dielectric layer, and the other end is exposed to the second surface of the first dielectric layer.

The second dielectric layer has a third surface and a fourth surface oppositely arranged, wherein the third surface is adjacent to the second surface of the first dielectric layer. The second patterned conductive layer is embedded in the second dielectric layer, and one side of the second patterned conductive layer is exposed to the third surface of the second dielectric layer to connect the first conductive pillar and the first conductive connecting element. The second power chip is embedded in the second dielectric layer and has a third electrode layout and a fourth electrode layout opposite to each other. The second power chip is bonded to the second patterned conductive layer in the second dielectric layer by the fourth electrode layout side through a second conductive adhesive layer. In addition, the electrode pad on the third electrode layout of the second power chip is provided with at least one second conductive connecting element, and one end of the second conductive connecting element is exposed to the fourth surface of the second dielectric layer. The projections of the second power chip and the first power chip are overlapped in the stacking direction. The second conductive pillar is embedded in the second dielectric layer, and one end of the second conductive pillar is connected to the second patterned conductive layer in the second dielectric layer, and the other end is exposed to the fourth surface of the second dielectric layer. The third patterned conductive layer is arranged on the fourth surface of the second dielectric layer to connect the second conductive pillar and the second conductive connecting element. The first electrode layout and the third electrode layout each have the drain and the gate, and the second electrode layout and the fourth electrode layout each have the source.

In one embodiment, the geometric contours of the contact surfaces of the electrode pad of the first electrode layout of the first power chip and the first conductive connecting element are similar.

In one embodiment, the geometric contours of the contact surfaces of the electrode pad of the third electrode layout of the second power chip and the second conductive connecting element are similar.

In one embodiment, the first patterned conductive layer includes a patterned conductive layer and an external conductive pillar layer, which are stacked on top of each other and electrically connected. The external conductive pillar layer has a columnar shape, and one end is exposed to the first surface of the first dielectric layer.

In one embodiment, the semiconductor package structure further includes a control chip, which has an active surface and a non-active surface opposed to each other, and the control chip is embedded in the first dielectric layer. The control chip is connected to the first patterned conductive layer with the non-active surface through the first conductive adhesive layer, and the active surface of the control chip is connected with the second patterned conductive layer through the first conductive connecting elements.

In one embodiment, the geometric contours of the contact surfaces of the electrode pad of the active surface of the control chip and the first conductive connecting element are similar.

In one embodiment, the semiconductor package structure further includes a control chip, which has an active surface and a non-active surface opposed to each other, and the control chip is embedded in the second dielectric layer. The control chip is connected to the second patterned conductive layer with the non-active surface through the second conductive adhesive layer, and the active surface of the control chip is made by plural of the second conductive connecting element and the third patterned conductive layer connect.

In one embodiment, the geometric contours of the contact surfaces of the electrode pad of the active surface of the control chip and the second conductive connecting element are similar.

In addition, to achieve the above objective, the invention also provides a method for manufacturing the semiconductor package structure, which includes the steps of providing a carrying board; forming a first stacked structure; and forming a second stacked structure. To further illustrate, the step of forming the first stacked structure includes forming a first patterned conductive layer on the carrying board; providing a first power chip, which has a first electrode layout and a second electrode layout arranged oppositely, to bond to the first patterned conductive layer with the the second electrode layout side through a first conductive adhesive layer; forming at least one first conductive connecting element on the electrode pad of the first electrode layout; forming at least one first conductive pillar on the first patterned conductive layer; and forming a first dielectric layer to cover the first patterned conductive layer, the first power chip and the first conductive pillar, and exposing one end of the first conductive pillar and one end of the first conductive connecting element.

The step of forming the second stacked structure includes forming a second patterned conductive layer on the first dielectric layer of the first stacked structure to connect the first conductive pillar and the first conductive connecting element; providing a second power chip, which has a third electrode layout and a fourth electrode layout arranged oppositely, to bond to the second patterned conductive layer with the fourth electrode layout side through a second conductive adhesive layer, wherein the projections of the second power chip and the first power chip are overlapped in the stacking direction; forming at least one second conductive connecting element on the electrode pad of the third electrode layout; forming at least one second conductive pillar on the second patterned conductive layer; forming a second dielectric layer to cover the second patterned conductive layer, the second power chip, and the second conductive pillar, and exposing one end of the second conductive pillar and one end of the second conductive connecting element; and forming a third patterned conductive layer on the second dielectric layer to connect the second conductive pillar and the second conductive connecting element. The first electrode layout and the third electrode layout each have the drain and the gate, and the second electrode layout and the fourth electrode layout each have the source.

In one embodiment, before the process of forming the first dielectric layer, the manufacturing method further includes the step of providing a control chip, which has an active surface and a non-active surface arranged oppositely, to bond to the first patterned conductive layer by the non-active surface side through a first adhesive layer, and the electrode pad of the active surface of the control chip is provided with at least one first conductive connecting element. After forming the first dielectric layer, the manufacturing method further includes the step of exposing one end of the first conductive pillar and one end of the first conductive connecting elements disposed on the first power chip and the control chip.

In one embodiment, before the process of forming the second dielectric layer, the manufacturing method further includes the step of providing a control chip, which has an active surface and a non-active surface arranged oppositely, to bond to the second patterned conductive layer by the non-active surface through a second adhesive layer, and the electrode pad of the active surface of the control chip is provided with at least one second conductive connecting element. After forming the second dielectric layer, the manufacturing method further includes the step of exposing one end of the second conductive pillar and one end of the second conductive connecting elements disposed on the second power chip and the control chip.

Furthermore, to achieve the above objective, the invention also provides a method for manufacturing the semiconductor package structure, which includes the steps of providing a carrying board; forming a first stacked structure; and forming a second stacked structure.

To further illustrate, the step of forming the first stacked structure includes forming a first patterned conductive layer on the carrying board; providing a first power chip, which has a first electrode layout and a second electrode layout arranged oppositely, to bond to the first patterned conductive layer with the second electrode layout side through a first conductive adhesive layer; forming at least one first conductive pillar on the first patterned conductive layer; forming a first dielectric layer to cover the first patterned conductive layer, the first power chip and the first conductive pillar, and exposing one end of the first conductive pillar; forming at least one first opening in the first dielectric layer to expose the first electrode layout of the first power chip; and forming a first conductive connecting element in the first opening to connect the first electrode layout.

The step of forming the second stacked structure further includes forming a second patterned conductive layer on the first dielectric layer of the first stacked structure to connect the first conductive pillar and the first conductive connecting element; providing a second power chip, which has a third electrode layout and a fourth electrode layout arranged oppositely, to bond to the second patterned conductive layer on the fourth electrode layout side through a second conductive adhesive layer, wherein the projections of the second power chip and the first power chip are overlapped in the stacking direction; forming at least one second conductive pillar on the second patterned conductive layer; forming a second dielectric layer to cover the second patterned conductive layer, the second power chip and the second conductive pillar, and exposing one end of the second conductive pillar; forming at least one second opening on the second dielectric layer to expose the third electrode layout of the second power chip; forming a second conductive connecting element in the second opening to connect the third electrode layout; forming a third patterned conductive layer on the second dielectric layer to connect the second conductive pillar and the second conductive connecting element. Among them, the first electrode layout and the third electrode layout each have the drain and the gate, and the second electrode layout and the fourth electrode layout each have the source.

In one embodiment, the step of forming the first stacked structure further includes the following steps: forming an external conductive pillar layer in a columnar shape on one surface of the carrying board; forming a first sub dielectric layer to cover the external conductive pillar layer and the surface of the carrying board; forming a patterned conductive layer on the external conductive pillar layer and the first sub dielectric layer, wherein the external conductive pillar layer and the patterned conductive layer together form the first patterned conductive layer; and after completing the manufacturing process of the first power chip and the first conductive pillar, a second sub dielectric layer is formed on the first sub dielectric layer to cover the first sub dielectric layer, the first patterned conductive layer, the first conductive adhesive layer, the first power chip and the first conductive pillar, and one end of the first conductive pillar is exposed. Among them, the first sub dielectric layer and the second sub dielectric layer together form the first dielectric layer.

In one embodiment, before the process of forming the first dielectric layer, the manufacturing method of the semiconductor package structure further includes the step of providing a control chip, which has an active surface and a non-active surface that are arranged oppositely, to combine with the first patterned conductive layer by the non-active surface side through the first adhesive layer. After forming the first dielectric layer, the manufacturing method further includes the steps of forming a plurality of first openings in the first dielectric layer to expose the first electrode layout of the first power chip and the active surface of the control chip and forming a plurality of first conductive connecting elements in the first openings to respectively connect the first electrode layout of the first power chip and the active surface of the control chip.

In one embodiment, before the process of forming the second dielectric layer, the manufacturing method of the semiconductor package structure further includes the step of providing a control chip, which has an active surface and a non-active surface that are arranged oppositely, to combine with the second patterned conductive layer by the non-active surface side through the second adhesive layer. After forming the second dielectric layer, the manufacturing method of the semiconductor package structure further includes the steps of forming a plurality of second openings in the second dielectric layer to expose the third electrode layout of the second power chip and the active surface of the control chip and forming a plurality of second conductive connecting elements in the second openings to respectively connect the third electrode layout of the second power chip and the active surface of the control chip.

In one embodiment, the first opening is formed by laser, plasma, machine drilling, or exposure and development etching (lithography) process. The first conductive connecting element is formed by electroplating, filler, deposition or patterning process.

In one embodiment, the second opening is formed by laser, plasma, machine drilling, or exposure and development etching (lithography) process. The second conductive connecting element is formed by electroplating, filler, deposition or patterning process.

As mentioned above, the semiconductor package structure of the invention and manufacturing method thereof is to stack the upper and lower layers of the first power chip and the second power chip, such as the semiconductor chip, with the chips facing the same direction, to shorten the electrical connection distance between the chips (that is, the first electrode layout of the first power chip can be directly electrically connected to the fourth electrode layout of the second power chip) to increase electrical performance. In addition, using the circuit layout structure to directly connect the first power chip and the second power chip instead of the conventional lead frame and the reflow welding process can also greatly improve the precision of the package structure and reduce the height (the thickness) of the package structure, and can meet the needs of environmental protection.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DESCRIPTION OF THE PREFERRED EMBODIMENT

In the following description, this invention will be explained with reference to embodiments thereof. However, the description of these embodiments is only for purposes of illustration rather than limitation. Hereinafter, the semiconductor package structure and the method for manufacturing the semiconductor package structure of the preferred embodiment of the present invention will be described with reference to related drawings.

Figure 1A:
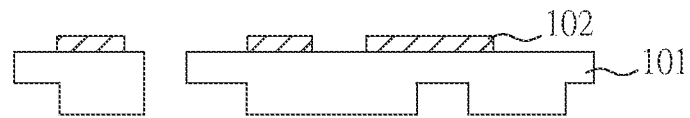
FIG. 1A to FIG. 1D are schematic diagrams showing the conventional manufacturing method of connecting transistors using the copper clip technology in the package structure of the prior art.
Figure 1B:
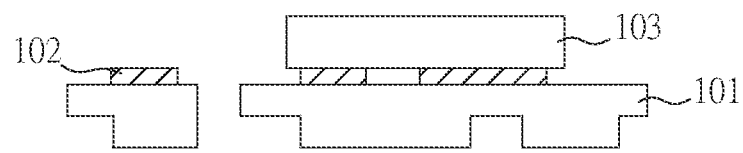
Figure 1C:
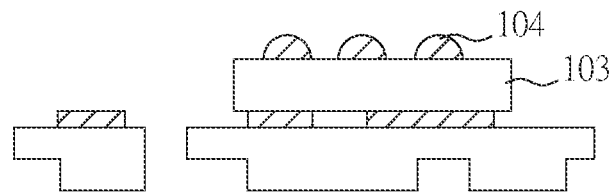
Figure 1D:
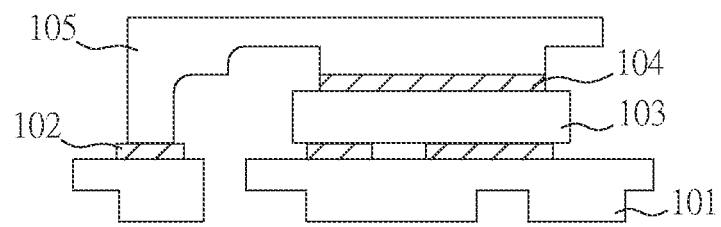
Figure 2:
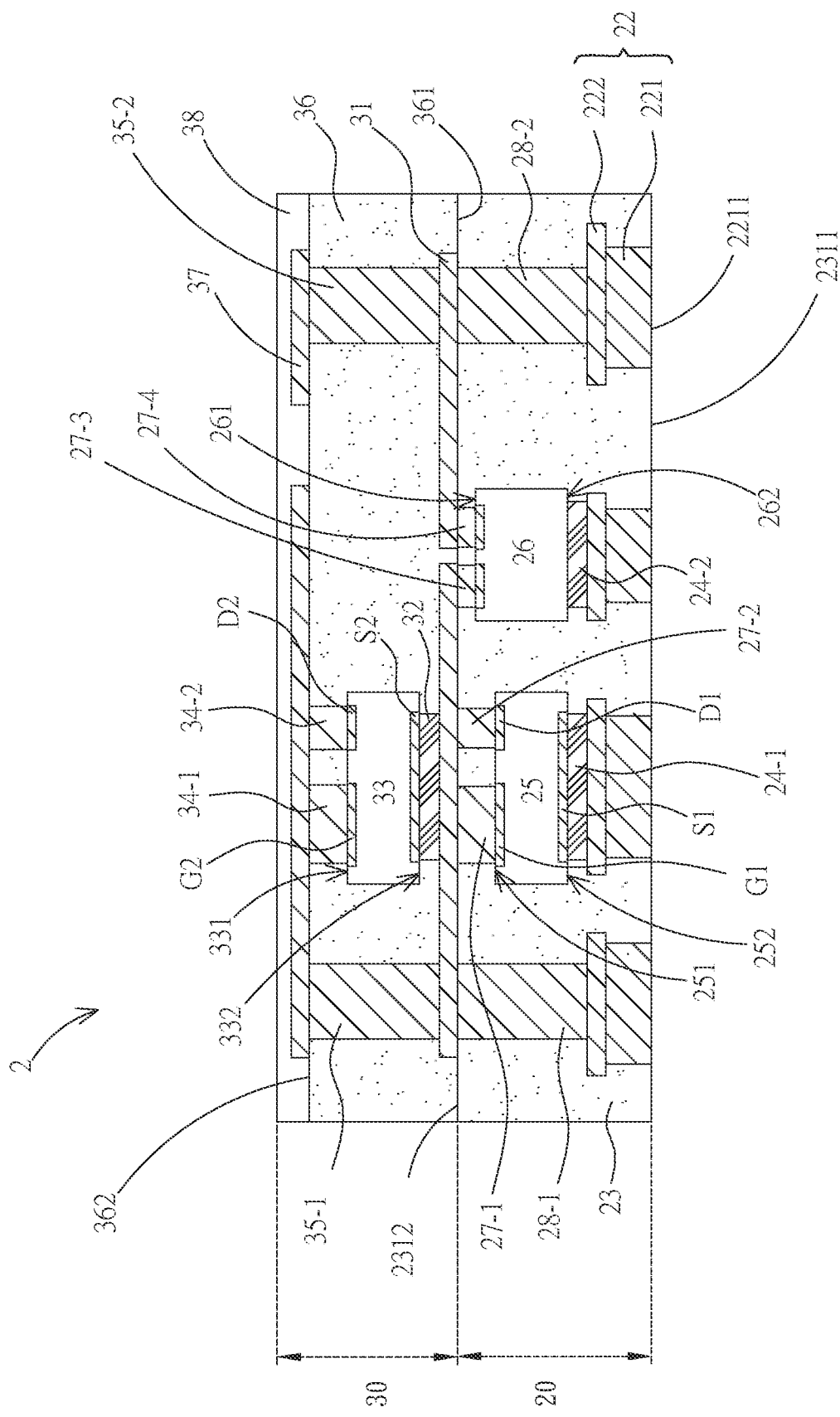
FIG. 2 is a schematic diagram showing the first aspect of the semiconductor package structure according to a preferred embodiment of the invention.

Referring to FIG. 2, the first aspect of a semiconductor package structure 2 of the preferred embodiment of the invention includes a first stacked structure 20 and a second stacked structure 30. Among them, the second stacked structure 30 is superimposed on the first stacked structure 20. The first stacked structure 20 includes a first patterned conductive layer 22, a first dielectric layer 23, a first conductive adhesive layer 24-1 and 24-2, a first power chip 25, a control chip 26, and four first conductive connecting elements 27-1, 27-2, 27-3, and 27-4, and two first conductive pillars 28-1 and 28-2. The second stacked structure 30 includes a second patterned conductive layer 31, a second conductive adhesive layer 32, a second power chip 33, two second conductive connecting elements 34-1 and 34-2, two second conductive pillars 35-1 and 35-2, a second dielectric layer 36, a third patterned conductive layer 37, and a protective layer 38.

The first dielectric layer 23 has a first surface 2311 and a second surface 2312 arranged opposite to each other. The first patterned conductive layer 22 is disposed on the first surface 2311 of the first dielectric layer 23. In detail, the first patterned conductive layer 22 is embedded in the first dielectric layer 23 and a surface 2211 of the first patterned conductive layer 22 is exposed to the first surface 2311 of the first dielectric layer 23.

In the embodiment, the first patterned conductive layer 22 has an external conductive pillar layer 221 and a patterned conductive layer 222 stacked on each other. The surface 2211 of the external conductive pillar layer 221 is exposed to the first surface 2311 of the first dielectric layer 23 that can be used as the electrode pad and can be electrically connected to other devices or structures, such as PCB circuit boards, etc., (not shown in figure). The material of the first patterned conductive layer 22 includes copper, and the exposed surface can further form a surface treatment layer, such as Immersion Tin (IT), Electroless Nickel Electroless Palladium Immersion Gold (ENEPIG), Electroless Nickel Electroless Palladium (ENEP), and Organic Solderability Preservatives (OSP).

The first power chip 25 has a first electrode layout 251 and a second electrode layout 252. Among them, the first electrode layout 251 and the second electrode layout 252 are arranged opposite to each other. The first power chip 25 is embedded in the first dielectric layer 23, and the first power chip 25 is embedded into the first dielectric layer 23, and the first power chip 25 is bonded to the patterned conductive layer 222 inside the first dielectric layer 23 by the second electrode layout 252 side through the first conductive adhesive layer 24-1.

The control chip 26 has an active surface 261 and a non-active surface 262 arranged opposite to each other. Similar to the first power chip 25, the control chip 26 is embedded in the first dielectric layer 23, and the control chip 26 is bonded to the patterned conductive layer 222 by the non-active surface 262 through the first conductive adhesive layer 24-2. In other embodiments, since the non-active surface 262 of the control chip 26 may not have a connection pad, the conductive function is not needed, and a cheaper adhesive layer may be used. However, in other embodiments, if the non-active surface of the control chip also has an output/input connection pad (I/O pad), then an adhesive layer with the conductive function must be selected used to be electrically connected to the first patterned conductive layer 22.

The first conductive adhesive layer 24-1 is disposed between the second electrode layout 252 and the patterned conductive layer 222 of the first power chip 25 to form an electrical connection. The first conductive adhesive layer 24-2 is disposed between the non-active surface 262 and the patterned conductive layer 222 of the control chip 26 to form an electrical connection.

The first conductive connecting elements 27-1 and 27-2 are disposed on the electrode pad of the first electrode layout 251 of the first power chip 25. The first conductive connecting elements 27-3 and 27-4 are disposed on the electrode pad of the active surface 261 of the control chip 26, and one end of the first conductive connecting elements 27-1, 27-2, 27-3, and 27-4 are exposed to the second surface 2312 of the first dielectric layer 23.

The first conductive pillars 28-1 and 28-2 are embedded in the first dielectric layer 23, one end of the first conductive pillars 28-1 and 28-2 is electrically connected to the patterned conductive layer 222, and the other end is exposed to the second surface 2312 of the first dielectric layer 23.

In one embodiment, the geometric contours of the contact surfaces of the electrode pad of the first electrode layout 251 of the first power chip 25 and the first conductive connecting elements 27-1 and 27-2 are similar, and the geometric contours of the contact surfaces of the electrode pad of the active surface 261 of the control chip 26 and the first conductive connecting elements 27-3 and 27-4 are similar. In this way, the electrical performance of the connection can be effectively improved.

The second dielectric layer 36 has a third surface 361 and a fourth surface 362 arranged opposite to each other. The third surface 361 is bonded to the second surface 2312 of the first dielectric layer 23. To further illustrate, the third surface 361 of the second dielectric layer 36 and the second surface 2312 of the first dielectric layer 23 are substantially the same plane.

The second patterned conductive layer 31 is located on the third surface 361 of the second dielectric layer 36, and is electrically connected to the active surface 261 of the control chip 26 and the first electrode layout 251 of the power chip 25 through the first conductive connecting elements 27-1, 27-2, 27-3, and 27-4 of the first stacked structure 20.

The second power chip 33 includes a third electrode layout 331 and a fourth electrode layout 332. The second power chip 33 is embedded in the second dielectric layer 36, and is bonded to the second patterned conductive layer 31 inside the second dielectric layer 36 with the fourth electrode layout 332 side through the second conductive adhesive layer 32.

The second conductive connecting elements 34-1 and 34-2 are provided in the third electrode layout 331 of the second power chip 33, and one end of the second conductive connecting elements 34-1 and 34-2 is exposed to the fourth surface 362 of the second dielectric layer 36.

The second conductive pillars 35-1 and 35-2 are embedded in the second dielectric layer 36, wherein one end is connected to the second patterned conductive layer 31 inside the second dielectric layer 36, and the other end is exposed to the fourth surface 362 of the second dielectric layer 36.

The third patterned conductive layer 37 is disposed on the fourth surface 362 of the second dielectric layer 36 to connect the second conductive pillars 35-1 and 35-2 and the second conductive connecting elements 34-1 and 34-2.

In one embodiment, the geometric contours of the contact surfaces of the electrode pad of the third electrode layout 331 of the second power chip 33 and the second conductive connecting elements 34-1 and 34-2 are similar.

In the embodiment, the first power chip 25 and the second power chip 33 are the same power chips, which are respectively a semiconductor chip, such as a Metal-Oxide-Semiconductor Field-Effect Transistor (MOSFET) chip. Therefore, the second electrode layout 252 and the fourth electrode layout 332 respectively has a source S1 and S2. In addition, the first electrode layout 251 and the third electrode layout 331 respectively has a gate G1 and G2 and a drain D1 and D2. In other words, the third electrode layout 331 is the same as the first electrode layout 251, and the fourth electrode layout 332 is the same as the second electrode layout 252. In addition, in other embodiments, the semiconductor chip may also be a bipolar junction transistor (BJT) chip or an insulated gate bipolar transistor (IGBT) chip.

In addition, in the embodiment, the material of the first dielectric layer 23 and the second dielectric layer 36 may be a high filler content dielectric material, such as a molding compound. The main matrix of the molding compound is based on Novolac-Based Resin, Epoxy-Based Resin or Silicone-Based Resin. The main matrix accounts for about 8 wt. % to 12 wt. % of the overall molding compound, and is formed by doping with a filler that accounts for about 70 wt. % to 90 wt. % of the overall ratio. Among them, the filler can include silica and alumina to increase mechanical strength, reduce linear thermal expansion coefficient, increase thermal conductivity, increase water resistance, and reduce glue overflow.

Next, as shown in FIG. 2 and FIGS. 3A to 3M, the first manufacturing method of the semiconductor package structure 2 includes steps S01 to S17.

Figure 3A:
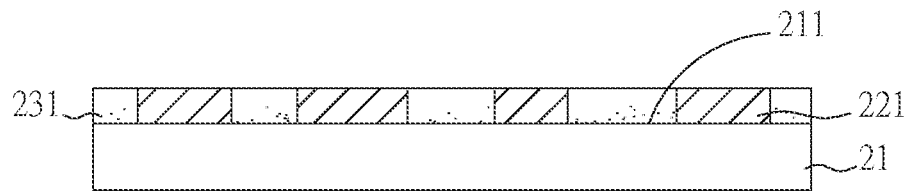
FIG. 3A to FIG. 3M are schematic diagrams showing the first manufacturing method of the semiconductor package structure according to a preferred embodiment of the invention.

As shown in FIG. 3A, step S01 is to provide a carrying board 21, which can be a metal plate or an insulating plate. It should be noted that the invention adopts a panel level type packaging process, in which the area of the carrying board 21 is multiple times the area of a single wafer. Accordingly, the panel level (large-size) carrying board 21 of the invention can simultaneously perform the packaging process for all the chips (or dies) cut from a plurality of wafers, which can effectively save the manufacturing time.

Then, in step S02, the external conductive pillar layer 221 is formed on the surface 211 of the carrying board 21. Then, step S03 is to form a first sub dielectric layer 231 on the surface 211 of the carrying board 21 and cover the external conductive pillar layer 221.

Figure 3B:
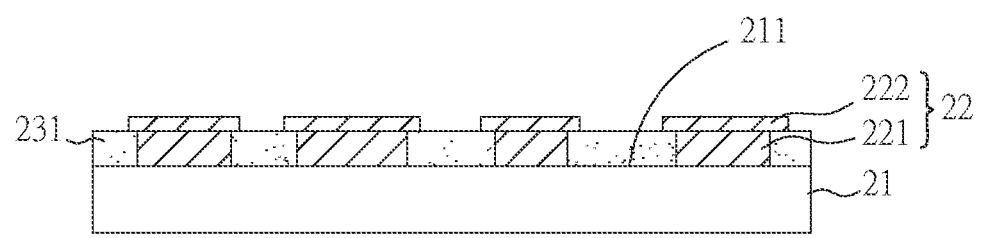

As shown in FIG. 3B, step S04 is to form a patterned conductive layer 222 on the external conductive pillar layer 221 and the first sub dielectric layer 231. The external conductive pillar layer 221 and the patterned conductive layer 222 together constitute a first patterned conductive layer 22. In the embodiment, the external conductive pillar layer 221 and the patterned conductive layer 222 can be completed by photolithography and metal plating technology, wherein the material is copper, for example.

Figure 3C:
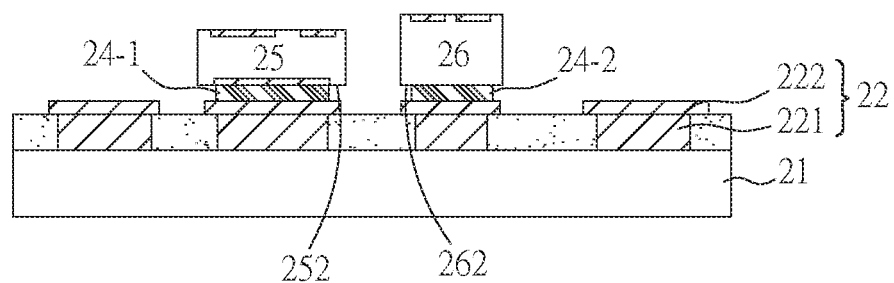

As shown in FIG. 3C, in step S05, the first power chip 25 is disposed on the first patterned conductive layer 22 through the first conductive adhesive layer 24-1, and the control chip 26 is disposed on the first patterned conductive layer 22 through the first conductive adhesive layer 24-2. In detail, the first power chip 25 and the control chip 26 are disposed on the patterned conductive layer 222. In the embodiment, the first power chip 25 is bonded and electrically connected to the patterned conductive layer 222 with the second electrode layout 252 through the first conductive adhesive layer 24-1. In addition, the control chip 26 is bonded and electrically connected to the patterned conductive layer 222 with the non-active surface 262 through the first conductive adhesive layer 24-2.

Figure 3D:
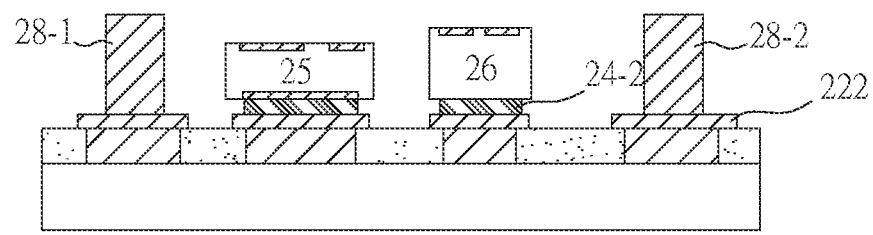

As shown in FIG. 3D, step S06 is to form a first conductive pillars 28-1 and 28-2 on the patterned conductive layer 222. In the embodiment, the first conductive pillars 28-1 and 28-2 can be completed by lithography and metal plating technology, and the material is copper, for example. In other embodiments, the first conductive pillars 28-1 and 28-2 can also be pre-shaped by electroless plating technology, and then disposed on the patterned conductive layer 222 through a conductive adhesive layer.

Figure 3E:
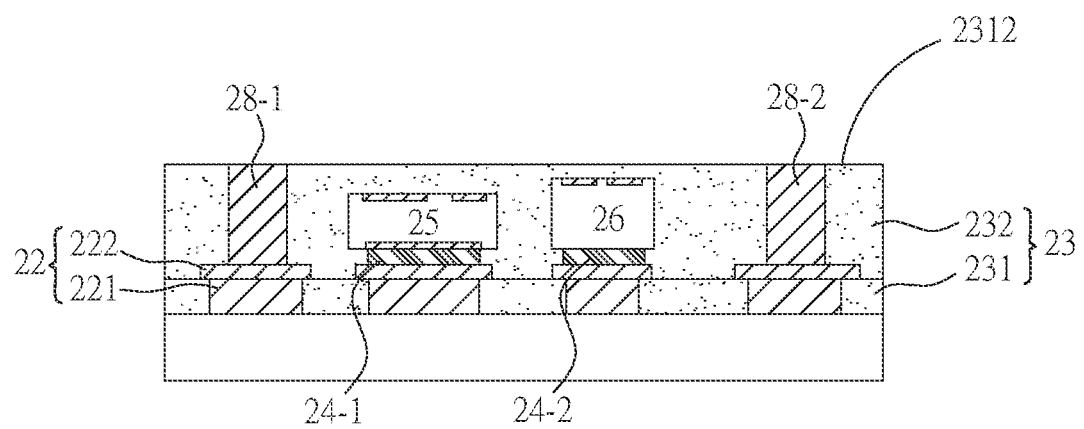

As shown in FIG. 3E, step S07 is to form a second sub dielectric layer 232 on the first sub dielectric layer 231, and cover the first patterned conductive layer 22, the first conductive adhesive layers 24-1 and 24-2, the first power chip 25, the control chip 26 and the first conductive pillars 28-1 and 28-2. In the invention, the first sub dielectric layer 231 and the second sub dielectric layer 232 constitute a first dielectric layer 23. It should be noted that after the second sub dielectric layer 232 is formed, one end surface of the first conductive pillars 28-1 and 28-2 can be exposed to the second surface 2312 of the first dielectric layer 23 by a polishing process.

Figure 3F:
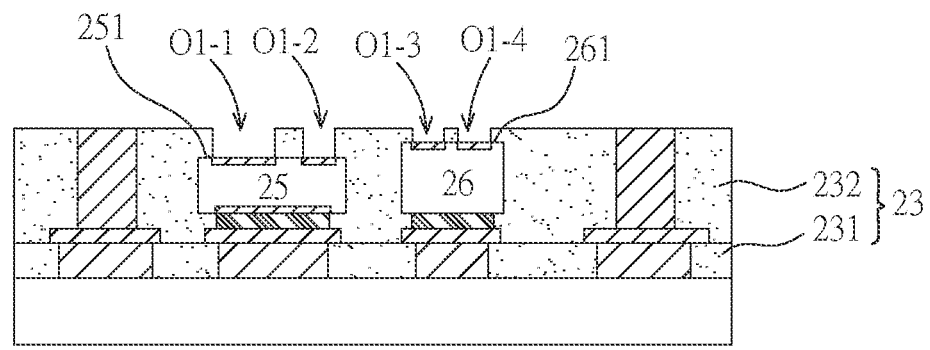

As shown in FIG. 3F, step S08 is to form a plurality of first openings O1-1, O1-2, O1-3, and O1-4 on the first dielectric layer 23 to expose parts of the first electrode layout 251 of the first power chip 25 and the active surface 261 of the control chip 26. Among them, the first openings O1-1, O1-2, O1-3, and O1-4 can be formed by laser drilling technology, plasma, machine drilling, or exposure and development etching process technology.

Figure 3G:
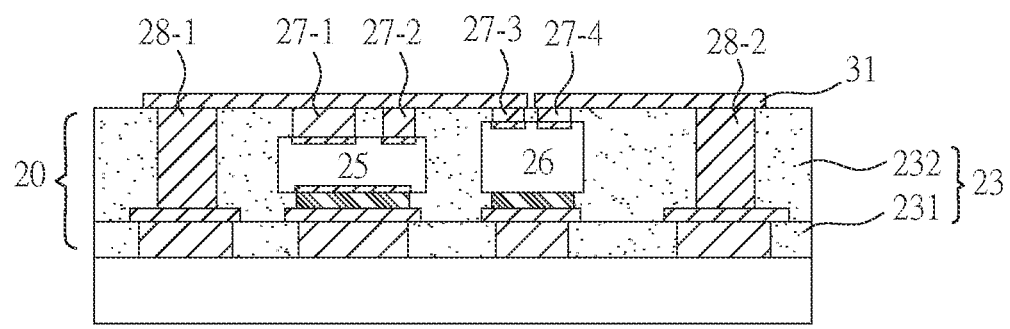

As shown in FIG. 3G, step S09 is to form a plurality of first conductive connecting elements 27-1, 27-2, 27-3, and 27-4 in the first openings O1-1, O1-2, O1-3, and O1-4. The second patterned conductive layer 31 is formed on the first dielectric layer 23 to electrically connect the first conductive pillars 28-1 and 28-2 and the first conductive connecting elements 27-1, 27-2, 27-3, and 27-4. Among them, the second patterned conductive layer 31 and the first conductive connecting elements 27-1, 27-2, 27-3, and 27-4 can be simultaneously completed by lithography and metal plating technology, and the material thereof is, for example, copper.

In other embodiments, the first conductive connecting elements 27-1, 27-2, 27-3, and 27-4 and the second patterned conductive layer 31 can also be formed by electroplating in stages. In addition, the second patterned conductive layer 31 and the first conductive connecting elements 27-1, 27-2, 27-3, and 27-4 can also be formed by fillers, deposition, or patterning processes.

Figure 3H:
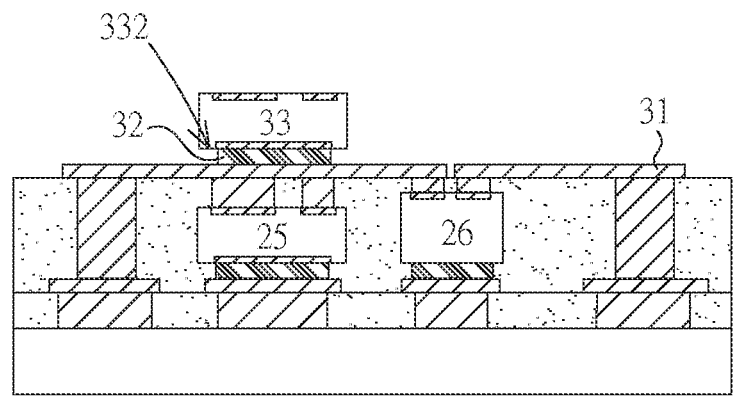

As shown in FIG. 3H, step S10 is to dispose a second power chip 33 on the second patterned conductive layer 31 through the second conductive adhesive layer 32. To further explain, the second power chip 33 is bonded and electrically connected to the second patterned conductive layer 31 through the second conductive adhesive layer 32 with the fourth electrode layout 332 side.

Figure 3I:
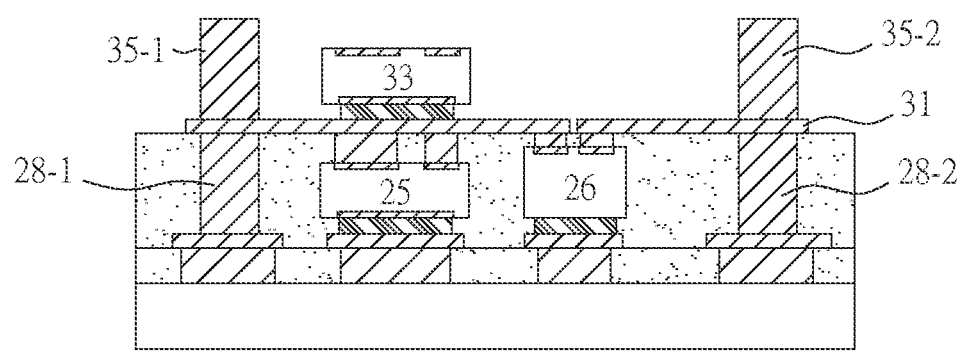

As shown in FIG. 3I, step S11 is to form a second conductive pillars 35-1 and 35-2 on the second patterned conductive layer 31. Similar to the first conductive pillars 28-1 and 28-2, the second conductive pillars 35-1 and 35-2 can be completed by lithography and metal plating technology, and the material is copper, for example. In other embodiments, the second conductive pillars 35-1 and 35-2 can also be pre-shaped by electroless plating, and then disposed on the second patterned conductive layer 31 through a conductive adhesive layer.

Figure 3J:
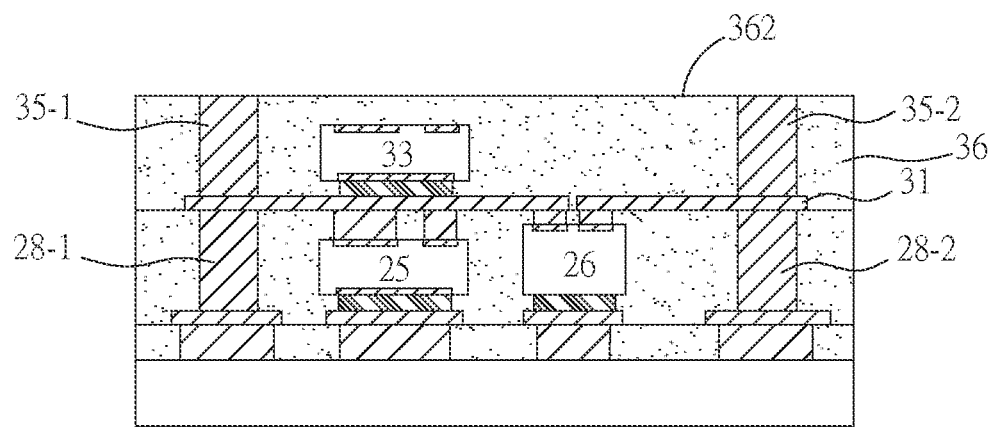

As shown in FIG. 3J, in step S12, the second dielectric layer 36 is formed to cover the second patterned conductive layer 31, the second power chip 33, and the second conductive pillars 35-1 and 35-2. It should be noted that after the second dielectric layer 36 is formed, one end surface of the second conductive pillars 35-1 and 35-2 can be exposed to the fourth surface 362 of the second dielectric layer 36 through a polishing process.

Figure 3K:
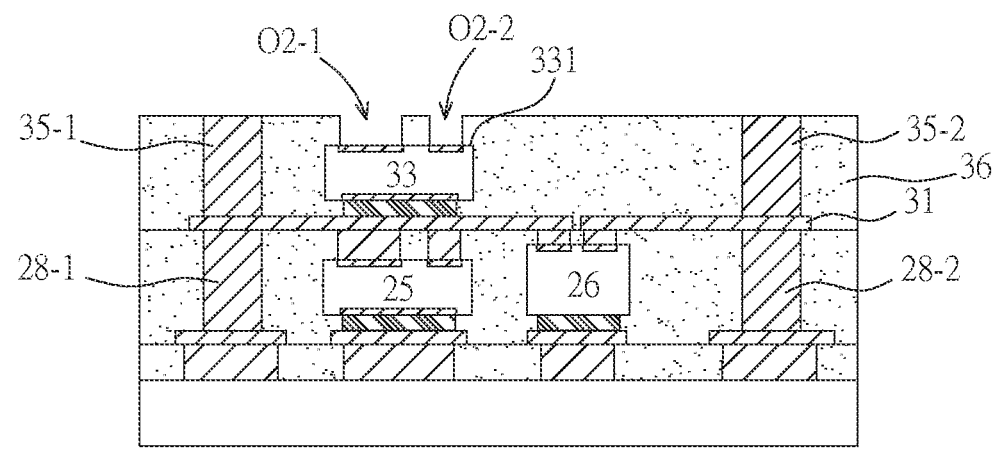

As shown in FIG. 3K, step S13 is to form a plurality of second openings O2-1 and O2-2 in the second dielectric layer 36 to expose the third electrode layout 331 of the second power chip 33. Similar to the first openings O1-1, O1-2, O1-3 and O1-4, the second openings O2-1 and O2-2 can be formed by laser drilling technology, plasma, machine drilling, or exposure, development and etching process technology.

Figure 3L:
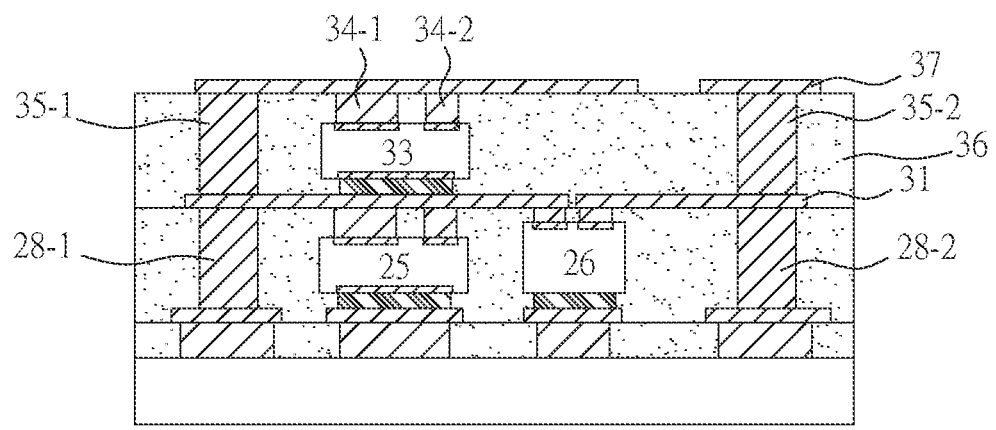

As shown in FIG. 3L, step S14 is to form a plurality of second conductive connecting elements 34-1 and 34-2 in the second openings O2-1 and O2-2 and form a third patterned conductive layer 37 on the second dielectric layer 36 to electrically connect to the second conductive pillars 35-1 and 35-2 and the second conductive connecting elements 34-1 and 34-2. Among them, the second conductive connecting elements 34-1 and 34-2 and the third patterned conductive layer 37 can also be completed by lithography and metal plating technology, and the material thereof is, for example, but not limited to copper. In other embodiments, the second conductive connecting elements 34-1 and 34-2 and the second patterned conductive layer 31 can also be formed by electroplating in stages. In addition, the second conductive connecting element and the third patterned conductive layer can also be formed by fillers or deposition or patterning processes.

Figure 3M:
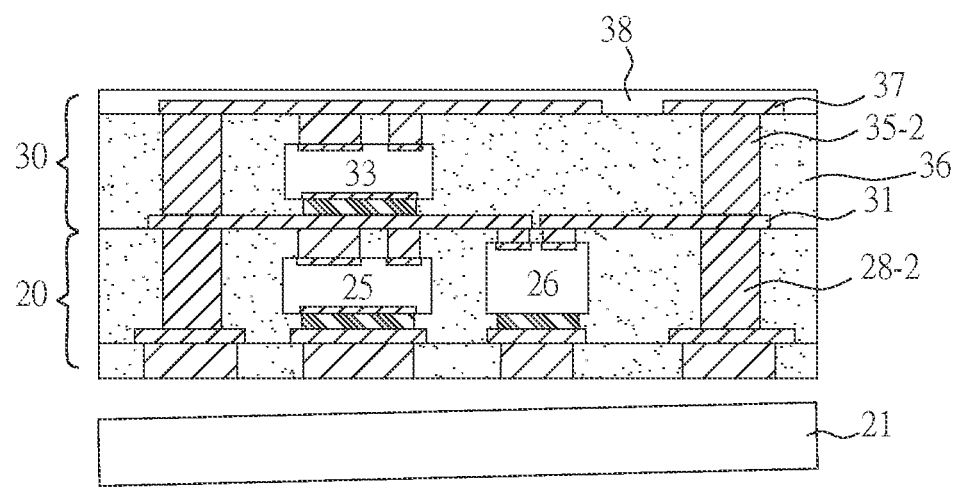

Finally, as shown in FIG. 3M, step S15 is to form a protective layer 38 and remove the carrying board 21 to form the semiconductor package structure 2 as shown in FIG. 2. Among them, the protective layer 38 is formed on the second dielectric layer 36 and covers the third patterned conductive layer 37. At the same time, the step so far is to form a second stacked structure 30 on the first stacked structure 20. In the embodiment, the material of the protective layer 38 can be insulating and anti-oxidation materials.

Next, the second manufacturing method of the semiconductor package structure 2 is to be briefly described below, which includes step S21 to step S36. Among them, step S21 to step S25 are the same as step S01 to step S05, so the description is omitted.

Figure 4A:
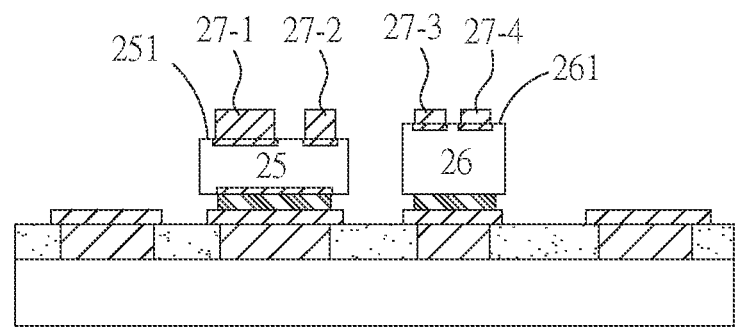
FIG. 4A to FIG. 4C are schematic diagrams showing a part of the second manufacturing method of the semiconductor package structure of the preferred embodiment of the invention.

Please refer to FIG. 4A, step S26 is to form a plurality of first conductive connecting elements 27-1 and 27-2 on the first electrode layout 251 of the first power chip 25, and form a plurality of first conductive connecting elements 27-3 and 27-4 on the active surface 261 of the control chip 26. Similar to the foregoing embodiment, the first conductive connecting elements 27-1, 27-2, 27-3, and 27-4 can be completed by photolithography and metal plating technology, and the material is copper, for example. Similar to the foregoing embodiment, the first conductive connecting elements 27-1, 27-2, 27-3, and 27-4 can be completed by lithography and metal plating technology, and the material is copper, for example.

In one embodiment, the geometric contours of the contact surfaces of the electrode pad of the first electrode layout 251 and the first conductive connecting element are similar. In addition, the geometric contours of the contact surfaces of the electrode pad of the active surface 261 of the control chip 26 and the first conductive connecting element are similar. The similarity of the geometrical contours of the contact surfaces mentioned above may include completely the same or slightly different due to process tolerances.

Figure 4B:
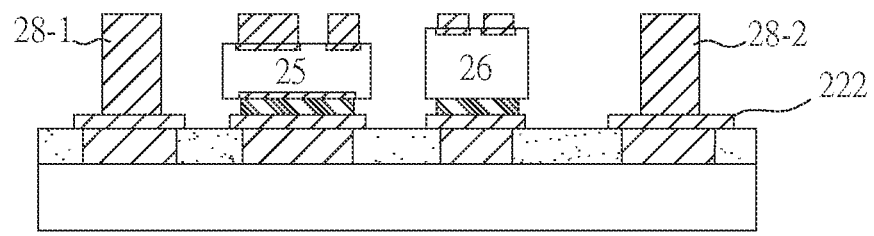

Next, as shown in FIG. 4B, step S27 is the same as step S07 to form a plurality of first conductive pillars 28-1 and 28-2 on the patterned conductive layer 222, and the rest of the details will not be repeated.

Figure 4C:
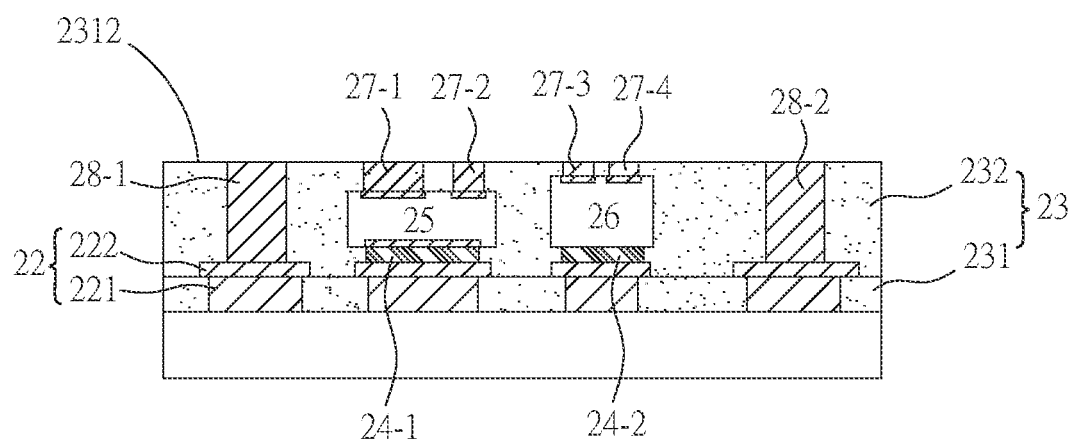

Then, as shown in FIG. 4C, step S28 is to form a second sub dielectric layer 232 on the first sub dielectric layer 231 and cover the first patterned conductive layer 22, the first conductive adhesive layers 24-1 and 24-2, the first power chip 25, the control chip 26, the first conductive connecting elements 27-1, 27-2, 27-3, and 27-4, and the first conductive pillars 28-1 and 28-2. It should be noted that after the second sub dielectric layer 232 is formed, one end surface of the first conductive pillars 28-1 and 28-2 and the first conductive connecting elements 27-1, 27-2, 27-3, and 27-4 are exposed to the second surface 2312 of the first dielectric layer 23.

The subsequent steps S29 to S36 are the same as the aforementioned steps S10 to S17, and finally the semiconductor package structure as shown in FIG. 2 is formed, so it will not be repeated here. Among them, before forming the second conductive pillars 35-1 and 35-2, the second conductive connecting elements 34-1 and 34-2 are formed on the third electrode layout 331 of the second power chip 33. Similar to the foregoing embodiment, the second conductive connecting elements 34-1 and 34-2 can be completed by lithography and metal electroplating, and the material thereof is, for example, copper.

In one embodiment, the geometric contours of the contact surfaces of the electrode pad of the third electrode layout 331 and the second conductive connecting elements 34-1 and 34-2 are similar to effectively improve electrical performance.

In addition to the above-mentioned first aspect, the semiconductor package structure of the invention has at least the following two variations. For the second aspect of the semiconductor package structure, please refer to FIG. 5 and related instructions, and for the third aspect of the semiconductor package structure, please refer to FIGS. 6A and 6B and related instructions.

Figure 5:
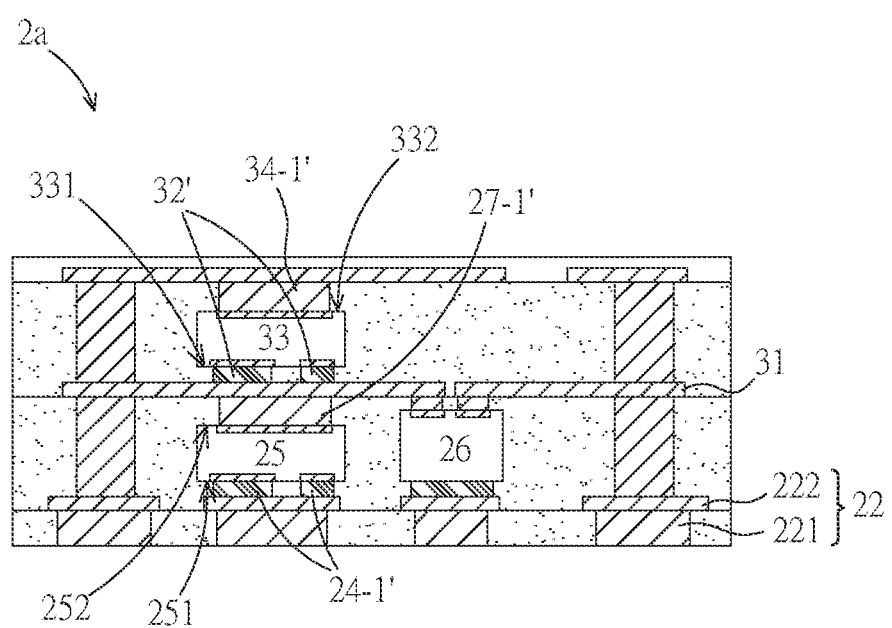
FIG. 5 is a schematic diagram showing the second aspect of the semiconductor package structure according to a preferred embodiment of the invention.

As shown in FIG. 5, the difference between the semiconductor package structure 2a of the second aspect and the semiconductor package structure 2 of the first aspect lies in the arrangement direction of the first power chip 25 and the second power chip 33 of the semiconductor package structure 2a and the first power chip 25 and the second power chip 33 of the semiconductor package structure 2 are arranged in opposite directions. In other words, the first power chip 25 is bonded to the first patterned conductive layer 22 with the first electrode layout 251 side through the first conductive adhesive layer 24-1', and the second power chip 33 is bonded to the second patterned conductive layer 31 with the third electrode layout 331 side through the second conductive adhesive layer 32'. The rest of the composition is the same as the previous embodiment and will not be repeated here.

In one embodiment, the geometric contours of the contact surfaces of the electrode pad of the second electrode layout 252 and the first conductive connecting element 27-1' are similar to effectively improve electrical performance.

In one embodiment, the geometric contours of the contact surfaces of the electrode pad of the fourth electrode layout 332 and the second conductive connecting element 34-1' are similar to effectively improve electrical performance.

Figure 6A:
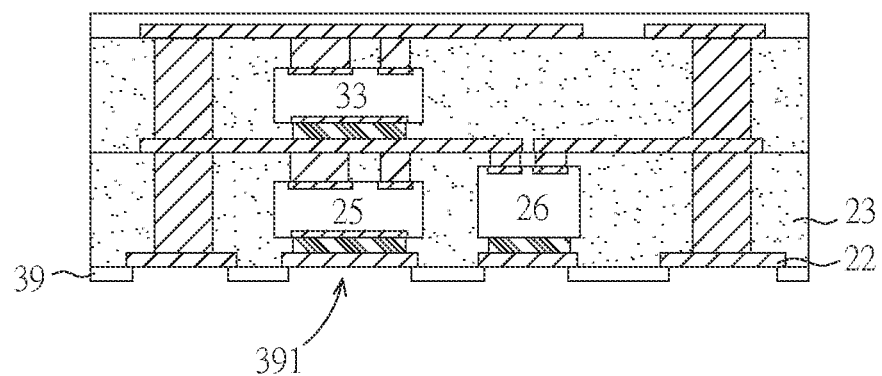
FIG. 6A and FIG. 6B are schematic diagrams showing the third aspect of the semiconductor package structure according to the preferred embodiment of the invention.
Figure 6B:
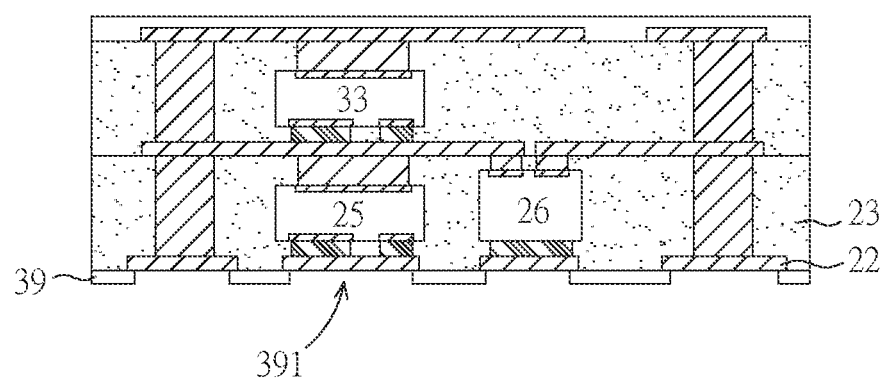

As shown in FIGS. 6A and 6B, the difference between the semiconductor package structure of the third aspect and the semiconductor package structure of the first aspect and the second aspect is that the first patterned conductive layer 22 only consists of the patterned conductive layer. Therefore, the first dielectric layer 23 is only composed of the second sub dielectric layer 232. In other words, the first patterned conductive layer 22 and the first dielectric layer 23 are each a single-layer structure, which can be formed in the same step. Furthermore, a solder mask layer 39 can be coated on the bottom side of the first patterned conductive layer 22, and the solder mask layer 39 is formed with a plurality of the openings 391 to expose a portion of the first patterned conductive layer 22 as the solder pads.

Figure 7:
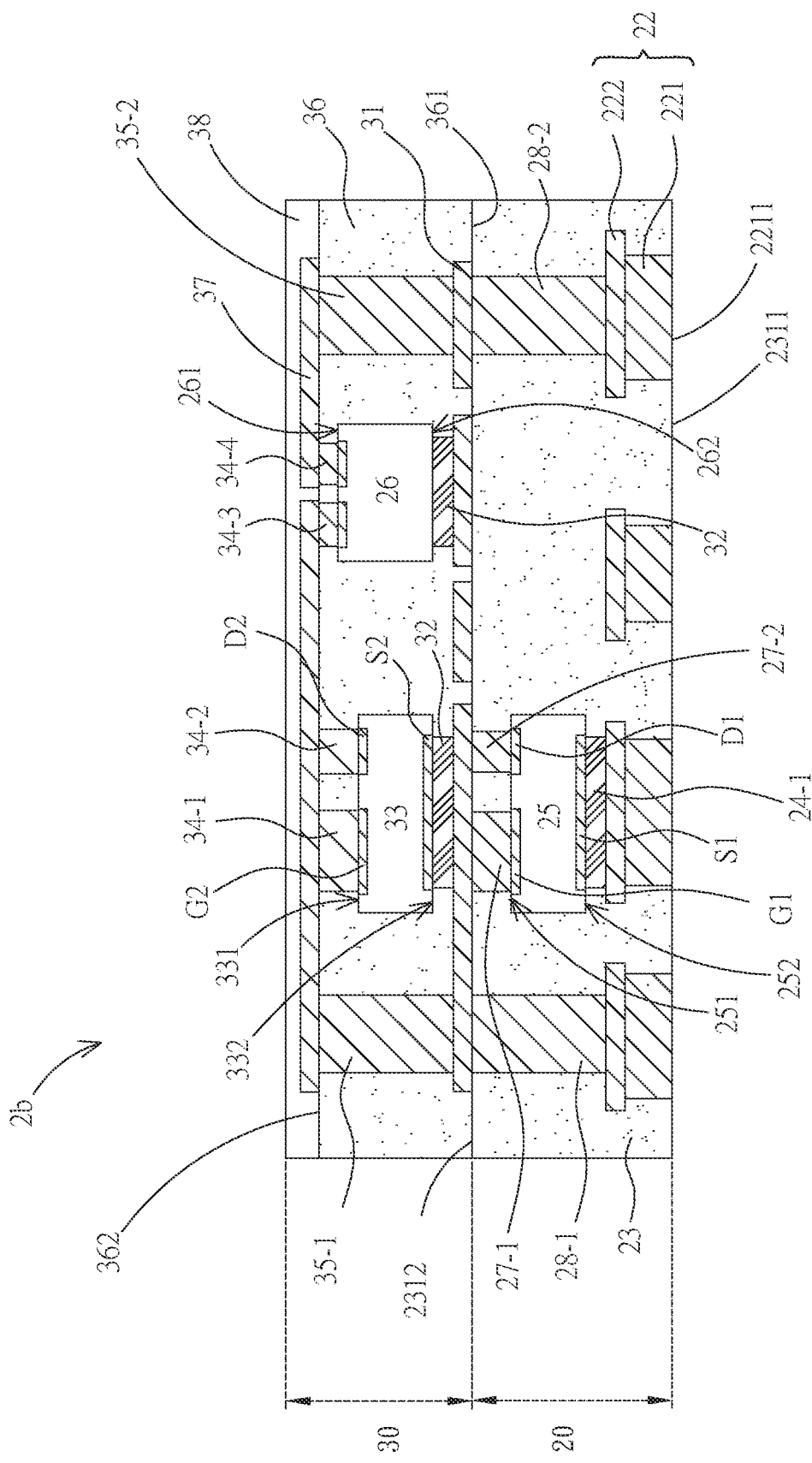
FIG. 7 is a schematic diagram showing the fourth aspect of the semiconductor package structure according to a preferred embodiment of the invention.

In the above three semiconductor packaging aspects, the control chip 26 in addition to being embedded in the first dielectric layer 23, can also be embedded in the second dielectric layer 36 and electrically connected to the third patterned conductive layer (as shown in FIG. 7) to make the overall design more flexible. Furthermore, the control chip 26 of the semiconductor package structure 2b is bonded to the second patterned conductive layer 31 with the non-active surface 262 side through the second adhesive layer 32, and electrically connected to the third patterned conductive layer 37 with the active surface 261 side through the second conductive connecting elements 34-3 and 34-4.

Furthermore, the above-mentioned first conductive connecting element and second conductive connecting element may also be conductive pillars, which may be copper pillars, copper alloy pillars or other conductive metal pillars formed by the electroplating process or the electroless plating process.

In summary, a semiconductor package structure and its manufacturing method of the invention is to arrange the first power chip and the second power chip, such as the semiconductor chip, in a mutually inverted manner, which has the following characteristics:

1. The first power chip and the second power chip are stacked in the upper and lower layers, and arranged in the same direction (for example, the first electrode layout and the third electrode layout are both facing up or down), so as to shorten the electrical transmission distance between power chips. In addition, direct electrical connection via electroplated copper conductors instead of electrical connection via the conventional lead frame and the solder ball can indeed increase electrical performance. Furthermore, the height of the package structure can be reduced due to there is no need to use the conventional lead frame.

2. The semiconductor process is used to replace the conventional lead frame reflow process to greatly improve the precision of the package structure.
3. The reflow process of the lead frame containing lead is discarded in the process, so it can meet the trend of environmental protection and the requirements of laws and regulations.
4. One side of the power chip is fixed to the first patterned conductive layer or the second patterned conductive layer by using a conductive adhesive layer (or adhesive layer), which can simplify the manufacturing process.

The above embodiments merely give the detailed technical contents of the present invention and inventive features thereof, and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor package structure, comprising:
a first stacked structure, comprising:
a first dielectric layer, which has a first surface and a second surface arranged opposite to each other;
a first patterned conductive layer, which is embedded in the first dielectric layer, and one side of the first patterned conductive layer is exposed to the first surface of the first dielectric layer;
a first power chip, which has a first electrode layout and a second electrode layout opposite to each other, embedded in the first dielectric layer and bonded to the first patterned conductive layer in the first dielectric layer by the second electrode layout side through a first conductive adhesive layer, wherein the first electrode layout of the first power chip is provided with at least one first conductive connecting element, and one end of the first conductive connecting element being exposed to the second surface of the first dielectric layer; and
at least one first conductive pillar, which is embedded in the first dielectric layer, one end of which is connected to the first patterned conductive layer in the first dielectric layer, and the other end is exposed to the second surface of the first dielectric layer; and
a second stacked structure, which is stacked on the first stacked structure, comprising:
a second dielectric layer having a third surface and a fourth surface arranged opposite to each other, wherein the third surface being adjacent to the second surface of the first dielectric layer;
a second patterned conductive layer, which is embedded in the second dielectric layer, one side of which being exposed to the third surface of the second dielectric layer to connect the first conductive pillar and the first conductive connecting element;
a second power chip, which has a third electrode layout and a fourth electrode layout arranged opposite to each other, embedded in the second dielectric layer and bonded to the second patterned conductive layer in the second dielectric layer by the fourth electrode layout side through a second conductive adhesive layer, wherein the third electrode layout of the second power chip being provided with at least one second conductive connecting element and one end of the second conductive connecting element is exposed to the fourth surface of the second dielectric layer, in which the projections of the second power chip and the first power chip being overlapped in the stacking direction;

at least one second conductive pillar, which is embedded in the second dielectric layer, one end of which is connected to the second patterned conductive layer in the second dielectric layer, and the other end is exposed to the fourth surface of the second dielectric layer; and a third patterned conductive layer, which is disposed on the fourth surface of the second dielectric layer and connected to the second conductive pillar and the second conductive connecting element.

2. The semiconductor package structure of claim 1, wherein the first electrode layout and the third electrode layout each comprises a drain and a gate, and the second electrode layout and the fourth electrode layout each comprises a source.

3. The semiconductor package structure of claim 1, wherein the first electrode layout and the third electrode layout each comprises a source, and the second electrode layout and the fourth electrode layout each comprises a drain and a gate.

4. The semiconductor package structure of claim 1, wherein the first patterned conductive layer comprises a patterned conductive layer and an external conductive pillar layer, which are stacked on top of each other and electrically connected, wherein the external conductive pillar layer has a columnar shape, and one end is exposed to the first surface of the first dielectric layer.

5. The semiconductor package structure of claim 1, further comprising: a control chip having an active surface and a non-active surface opposed to each other and embedded in the first dielectric layer and connected to the first patterned conductive layer with the non-active surface through the first conductive adhesive layer, wherein the active surface of the control chip is connected with the second patterned conductive layer through a plurality of first conductive connecting elements.

6. The semiconductor package structure of claim 1, further comprising: a control chip having an active surface and a non-active surface opposed to each other and embedded in the second dielectric layer and connected to the second patterned conductive layer with the non-active surface through the second conductive adhesive layer, wherein the active surface of the control chip is connected with the third patterned conductive layer through a plurality of second conductive connecting elements.

7. A manufacturing method of a semiconductor package structure, comprising the following steps:

providing a carrying board;

forming a first patterned conductive layer on the carrying board;

providing a first power chip, which has a first electrode layout and a second electrode layout arranged opposite to each other, to bond to the first patterned conductive layer by the second electrode layout side through a first conductive adhesive layer;

forming at least one first conductive connecting element on the first electrode layout of the first power chip;

forming at least one first conductive pillar on the first patterned conductive layer;

forming a first dielectric layer to cover the first patterned conductive layer, the first power chip, and the first conductive pillar and exposing one end of the first conductive pillar and one end of the first conductive connecting element so as to form a first stacked structure on the carrying board;

forming a second patterned conductive layer on the first dielectric layer of the first stacked structure to connect the first conductive pillar and the first conductive connecting element;

providing a second power chip, which has a third electrode layout and a fourth electrode layout arranged opposite to each other, to bond to the second patterned conductive layer by the fourth electrode layout side through a second conductive adhesive layer, wherein the third electrode layout is provided with at least one second conductive connecting element, wherein the projections of the second power chip and the first power chip overlap in the stacking direction;

forming at least one second conductive connecting element on the third electrode layout of the second power chip;

forming at least one second conductive pillar on the second patterned conductive layer;

forming a second dielectric layer to cover the second patterned conductive layer, the second power chip, and the second conductive pillar and exposing one end of the second conductive pillar and one end of the second conductive connecting element;

forming a third patterned conductive layer on the second dielectric layer to connect the second conductive pillar and the second conductive connecting element so as to form a second stacked structure on the first stacked structure; and removing the carrying board.

8. The manufacturing method of claim 7, wherein the first electrode layout and the third electrode layout each comprises a drain and a gate, and the second electrode layout and the fourth electrode layout each comprises a source.

9. The manufacturing method of claim 7, wherein the first electrode layout and the third electrode layout each comprises a source, and the second electrode layout and the fourth electrode layout each comprises a drain and a gate.

10. The manufacturing method of claim 7, further comprising:

before the process of forming the first dielectric layer, providing a control chip, which has an active surface and a non-active surface arranged opposite to each other, to bond to the first patterned conductive layer by the non-active surface side through a first adhesive layer;

simultaneously forming a plurality of first conductive connecting elements on the third electrode layout of the second power chip and the active surface of the control chip; and after forming the first dielectric layer, exposing one end of the first conductive pillar and one end of the first conductive connecting elements disposed on the first power chip and the control chip.

11. The manufacturing method of claim 7, further comprising;

before the process of forming the second dielectric layer, providing a control chip, which has an active surface and a non-active surface arranged opposite to each other, to bond to the second patterned conductive layer by the non-active surface side through a second adhesive layer, and the active surface of the control chip being provided with a plurality of second conductive connecting elements; and after forming the second dielectric layer, exposing one end of the second conductive pillar and one end of the second conductive connecting elements disposed on the second power chip and the control chip.

12. A manufacturing method of a semiconductor package structure, comprising the following steps:
providing a carrying board;
forming a first patterned conductive layer on the carrying board;
providing a first power chip, which has a first electrode layout and a second electrode layout arranged opposite to each other, to bond to the first patterned conductive layer by the second electrode layout side through a first conductive adhesive layer;
forming at least one first conductive pillar on the first patterned conductive layer;
forming a first dielectric layer to cover the first patterned conductive layer, the first power chip, and the first conductive pillar, and exposing one end of the first conductive pillar;
forming at least one first opening in the first dielectric layer to expose the first electrode layout of the first power chip;
forming a first conductive connecting element in the first opening to connect the first electrode layout so as to form a first stacked structure on the carrying board;
forming a second patterned conductive layer on the first dielectric layer of the first stacked structure to connect the first conductive pillar and the first conductive connecting element;
providing a second power chip, which has a third electrode layout and a fourth electrode layout arranged opposite to each other, to bond to the second patterned conductive layer by the fourth electrode layout side through a second conductive adhesive layer, wherein the third electrode layout is provided with at least one second conductive connecting element, wherein the projections of the second power chip and the first power chip overlap in the stacking direction;
forming at least one second conductive pillar on the second patterned conductive layer;
forming a second dielectric layer to cover the second patterned conductive layer, the second power chip, and exposing the second conductive pillar, and one end of the second conductive pillar;
forming at least one second opening in the second dielectric layer to expose the third electrode layout of the second power chip;
forming a second conductive connecting element in the second opening to connect the third electrode layout;
forming a third patterned conductive layer on the second dielectric layer to connect the second conductive pillar and the second conductive connecting element so as to form a second stacked structure on the first stacked structure; and
removing the carrying board.

13. The manufacturing method of claim 12, wherein the first electrode layout and the third electrode layout each comprises a drain and a gate, and the second electrode layout and the fourth electrode layout each comprises a source.

14. The manufacturing method of claim 12, wherein the first electrode layout and the third electrode layout each comprises a source, and the second electrode layout and the fourth electrode layout each comprises a drain and a gate.

15. The manufacturing method of claim 12, wherein:
the first opening is formed by a laser process, a plasma process, a machine drilling process, or an exposure, development and etching process; and
the first conductive connecting element is formed by an electroplating process, a filling process, a deposition process, or a patterning process.

16. The manufacturing method of claim 12, wherein:
the second opening is formed by a laser process, a plasma process, a machine drilling process, or an exposure, development and etching process; and
the second conductive connecting element is formed by an electroplating process, a filling process, a deposition process, or a patterning process.

17. The manufacturing method of claim 12, further comprising:
before the process of forming the first dielectric layer, providing a control chip, which has an active surface and a non-active surface arranged opposite to each other, to bond to the first patterned conductive layer by the non-active surface side through a first adhesive layer;
after forming the first dielectric layer, forming a plurality of first openings in the first dielectric layer to expose the first electrode layout of the first power chip and the active surface of the control chip; and
forming a plurality of first conductive connecting elements in the first openings to respectively connect the first electrode layout of the first power chip and the active surface of the control chip.

18. The manufacturing method of claim 17, wherein:
the first opening is formed by a laser process, a plasma process, a machine drilling process, or an exposure, development and etching process; and
the first conductive connecting element is formed by an electroplating process, a filling process, a deposition process, or a patterning process.

19. The manufacturing method of claim 12, further comprising:
before the process of forming the second dielectric layer, providing a control chip, which has an active surface and a non-active surface arranged opposite to each other, to bond to the second patterned conductive layer by the non-active surface side through a second adhesive layer;
after forming the second dielectric layer, forming a plurality of second openings in the second dielectric layer to expose the third electrode layout of the second power chip and the active surface of the control chip; and
forming a plurality of second conductive connecting elements in the second openings to respectively connect the third electrode layout of the second power chip and the active surface of the control chip.

20. The manufacturing method of claim 19, wherein:
the second opening is formed by a laser process, a plasma process, a machine drilling process, or an exposure, development and etching process; and
the second conductive connecting element is formed by an electroplating process, a filling process, a deposition process, or a patterning process.

* * * * *